United States Patent [19]

Yoshida et al.

[11] Patent Number: 5,187,123
[45] Date of Patent: Feb. 16, 1993

[54] METHOD FOR BONDING A SEMICONDUCTOR DEVICE TO A LEAD FRAME DIE PAD USING PLURAL ADHESIVE SPOTS

[75] Inventors: Hiroyoshi Yoshida, Uji; Yuki Koishi, Yawata, both of Japan

[73] Assignee: Matsushita Electric Industrial Co., Ltd., Osaka, Japan

[21] Appl. No.: 815,621

[22] Filed: Dec. 30, 1991

Related U.S. Application Data

[63] Continuation of Ser. No. 344,393, Apr. 28, 1989, abandoned.

[30] Foreign Application Priority Data

Apr. 30, 1988 [JP] Japan ............... 63-108392

[51] Int. Cl.$^5$ ............................................. H01L 21/58
[52] U.S. Cl. ..................................... 437/220; 228/123
[58] Field of Search .............. 29/831, 840; 437/212, 437/216, 222; 228/123, 175, 180.1, 180.2, 254; 156/295

[56] References Cited

U.S. PATENT DOCUMENTS

| | | | |
|---|---|---|---|
| 2,264,632 | 12/1941 | Gerlitzki | 118/DIG. 3 |
| 3,963,551 | 6/1976 | Marlinski | 118/401 |
| 4,239,576 | 12/1980 | Taki et al. | 156/297 |
| 4,255,644 | 3/1981 | Delorme | 228/44.7 |
| 4,480,983 | 11/1984 | Adams et al. | 425/467 |
| 4,515,297 | 5/1985 | Schoenthalen et al. | 222/160 |
| 4,545,840 | 10/1985 | Newman et al. | 437/211 |
| 4,577,398 | 3/1986 | Sliwa et al. | 437/184 |
| 4,709,849 | 12/1987 | Socolowski | 228/246 |
| 4,803,124 | 2/1989 | Kunz | 156/578 |

FOREIGN PATENT DOCUMENTS

| | | | |
|---|---|---|---|
| 59-205726 | 11/1984 | Japan | 437/209 |
| 60-105242 | 6/1985 | Japan | 437/209 |
| 60-117741 | 6/1985 | Japan | 437/209 |
| 60-161638 | 8/1985 | Japan | 437/209 |
| 62-73639 | 4/1987 | Japan | 437/209 |
| 63-300519 | 12/1988 | Japan | 437/209 |

Primary Examiner—Olik Chaudhuri
Assistant Examiner—David E. Graybill
Attorney, Agent, or Firm—Wenderoth, Lind & Ponack

[57] ABSTRACT

This invention relates to a die bonding method used for adhering the die of a semiconductor device to a die pad of lead frame. Adhesive paste is applied in spots on the surface of the die pad by means of plural nozzles arranged radially, pressing a die thereon to spread the adhesive paste widely, and adhere the die to the die pad by hardening the adhesive paste. When the plural nozzles are arranged radially in this manner, the adhesive paste applied in spots on the die pad surface is also radial. Accordingly, when the die pad is pressed on, the adhesive paste spreads widely along the back surface of the die while forcing out air, thereby preventing voids from staying inside the adhesive paste. As a result, the die adhesion strength is increased, and the thermal and electrical conductivity are improved.

36 Claims, 14 Drawing Sheets

METHOD FOR BONDING A SEMICONDUCTOR DEVICE TO A LEAD FRAME DIE PAD USING PLURAL ADHESIVE SPOTS

This application is a continuation of now abandoned application Ser. No. 07/344,393, filed on Apr. 28, 1989, abandoned.

BACKGROUND OF THE INVENTION

This invention relates to a die bonding method for adhering semiconductor chips to a lead frame.

When assembling a semiconductor device, the die pad surface of a lead frame is coated with an adhesive paste such as silver epoxy paste, and a semiconductor chip called a die is pressed thereon, to adhere the die to the die pad. At this time, if too much adhesive paste is applied, it may flow out and cause problems in the subsequent wire bonding work. On the other hand, if the application of adhesive paste is insufficient, the air remaining in the adhesive paste is not forced out completely from the layer of the adhesive paste when spreading the adhesive paste with the die, and voids may be left in the adhesive paste. When the adhesive paste is cured in such a state, not only is the adhesive strength of the die lowered, but the thermal and electrical conductivity between the die and die pad is also lowered.

To solve such problems, hitherto, the die bonding method as shown in FIGS. 12 to 17 has been known.

First, as shown in FIG. 12, plural nozzles 21 are disposed at the end of a nozzle head, and an adhesive paste 24 is applied in spots on the surface of a die pad 23 of a lead frame 22 from each nozzle 21. Then, as shown in FIG. 13, while holding a die 26 by means of a chuck 25, the back side of the die 26 is pressed against the surface of the die pad 23, and the position of the die 26 is determined while spreading the adhesive paste 24 outward, and the adhesive paste 24 is cured in the state shown in FIG. 14.

In this die bonding method, however, the same problems as mentioned above occur. That is, in the conventional die bonding method shown in FIGS. 12 to 14, plural nozzles are arranged in a matrix as shown in FIG. 15. Accordingly, when the adhesive paste 24 is applied to the surface of die-pad 23 and the die 26 is pressed, the air remaining between the plural spots of adhesive page 24 and the die 26 is often not expelled out completely to the outside through the spots of the adhesive page 24. Voids 27 are then left over in the adhesive paste 24 as shown in FIG. 16. When the adhesive paste 24 is cured in this state, as shown in FIG. 17, voids 27 remain in the adhesive paste 24, and the adhesion strength of the die 26 is weak, and the die 26 may be easily separated from the die pad 23, or the thermal and electrical conductivity from the die 26 to the die pad 23 may be worsened.

SUMMARY OF THE INVENTION

It is hence a first object of the invention to present a die bonding method for a semiconductor device capable of improving the thermal and electrical conductivity of the device by firmly adhering a die to a die pad of a lead frame.

It is a second object of the invention to present a die bonding method for a semiconductor device capable of adhering a square or similarly shaped die firmly to the die pad.

It is a third object of the invention to present a die bonding method for a semiconductor device capable of adhering a rectangular die with a large aspect ratio stably and firmly to the die pad.

Other objects of the invention will be further understood and appreciated from the following detailed description taken in conjunction with the drawings.

DETAILED DESCRIPTION OF THE INVENTION

A first embodiment of the invention is shown in FIGS. 1 to 4.

Figure 12:
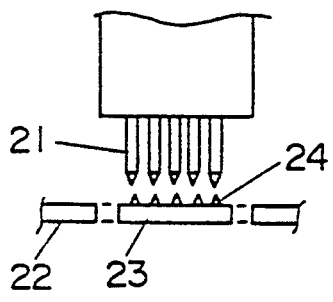
FIG. 12, FIG. 13 and FIG. 14 are side views showing a conventional die bonding method in sequence.
Figure 13:
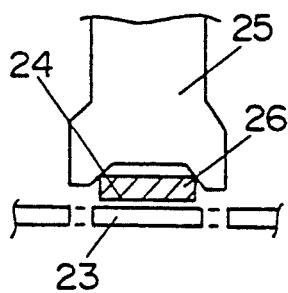
Figure 14:
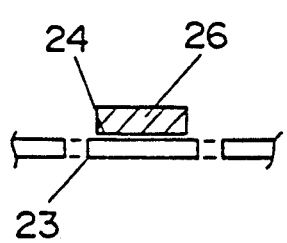
Figure 15:
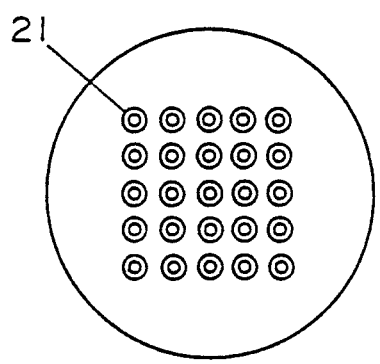
FIG. 15 is a bottom view of a conventional nozzle apparatus.

The step of applying adhesive paste, the step of adhering the die, and the step of hardening the adhesive paste are basically the same as in the prior art, shown in FIGS. 12 to 14.

Figure 1:
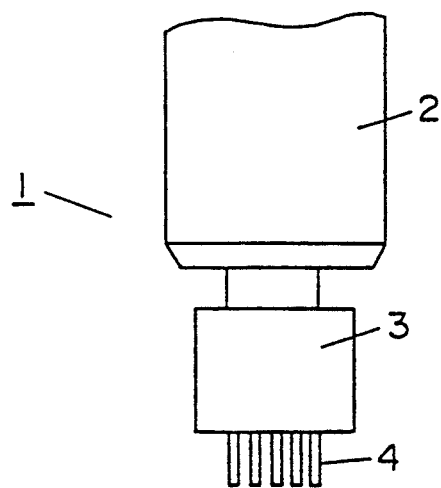
FIG. 1 is a side view of a nozzle apparatus used in a first embodiment of the invention.
Figure 2:
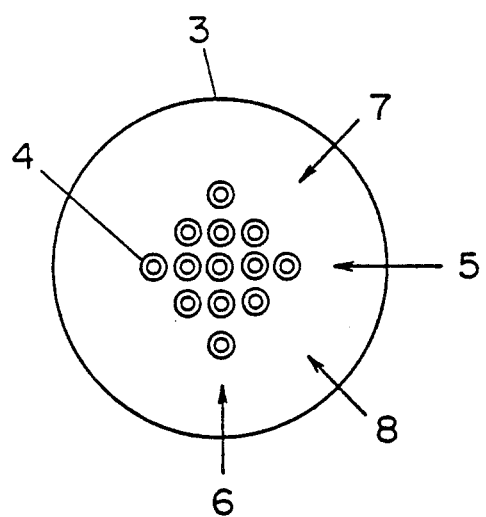
FIG. 2 is a bottom view of the nozzle apparatus of FIG. 1.

FIG. 1 and FIG. 2 show the nozzle apparatus used in the first embodiment of the invention. A nozzle apparatus 1 comprises, as shown in FIG. 1, a syringe 2 for holding the adhesive paste, a nozzle head 3, and plural nozzles 4 attached to the tip of the nozzle head 3. The plural nozzles 4 are radially arranged as shown in FIG. 2. That is, a nozzle row 5 and a nozzle row 6 are arranged to cross with each other orthogonally, while a nozzle row 7 and a nozzle row 8 are arranged at intermediate angles of the angle formed by the nozzle rows 5 and 6. In the embodiment shown in FIG. 2, the nozzle rows 5 and 6 are composed of five nozzles each, and the nozzle rows 7 and 8 are composed of three nozzles each.

Figure 3:
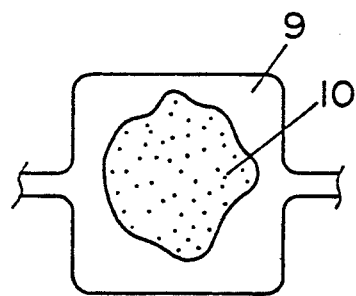
FIG. 3 is a plan view showing the state of adhesive paste spread widely on the surface of a die pad in the first embodiment.

By using such a nozzle apparatus 1, an adhesive paste, such as a silver epoxy paste, is applied in spots on the surface of the die pad of lead frame. In this state, when the die is pressed against the die pad, the adhesive paste spreads outward form the central part while pressing down the voids. that is, the adhesive paste applied in spots spreads out from the center toward the outside while linking with the adjacent adhesive paste spots. Since the nozzle rows (that is, the adhesive paste rows) are radial, the spreading routes of the adhesive paste are also nearly radial. Accordingly, the air existing among the adhesive paste is forced outward, and not entrapped among the adhesive paste. As a result, the adhesive paste 10 spreads on the surface of the die pad 9 without leaving voids as shown in FIG. 3.

Figure 4:
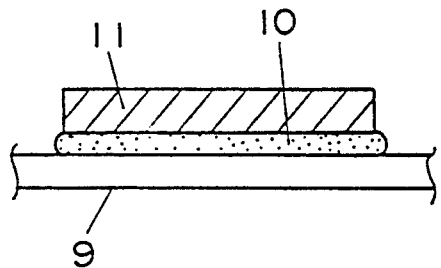
FIG. 4 is a sectional view showing the state of adhesion of a die to the die pad in the first embodiment.

In this way, after spreading widely the adhesive paste 10 and determining the die position, when the adhesive paste 10 is hardened, the die 11 is adhered to the die pad 9 through a void-free adhesive paste 10, as shown in FIG. 4. Accordingly, the adhesion strength of the die 11 is enhanced, and the thermal and electrical conductivity is improved, too.

Recently, meanwhile, along with the increase in the degree of integration, the size of the chip (die) has become larger, and the shape of the chip (die) has varied, ranging from square to rectangular.

Figure 5:
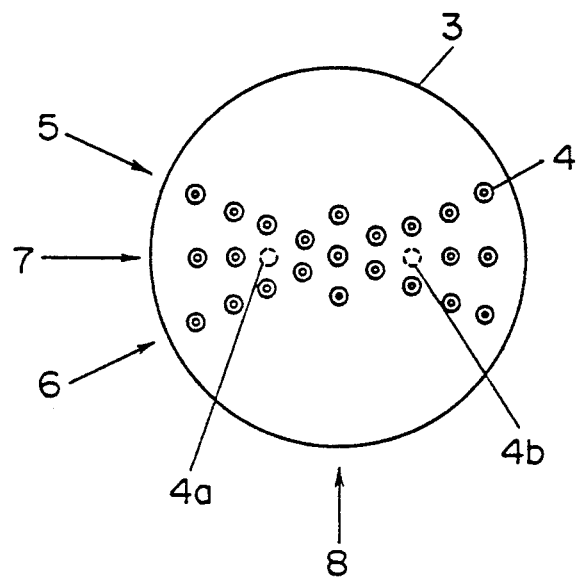
FIG. 5 is a bottom view of other nozzle apparatus used in the first embodiment.

FIG. 5 shows an example of a radial arrangement of nozzles 4 for adhesion of a rectangular die with a relatively large aspect ratio. In FIG. 5, the nozzle rows 5 and 6 are composed of nine nozzles each, and are crossing at angles of about 60 degrees (or 120 degrees). The nozzle row 7 has five nozzles, and is arranged at intermediate angles of 60 degrees formed with the nozzle rows 5 and 6. The nozzle row 8 has three nozzles, which are arranged at intermediate angles of 120 degrees formed by the nozzle rows 5 and 6.

Figure 6:
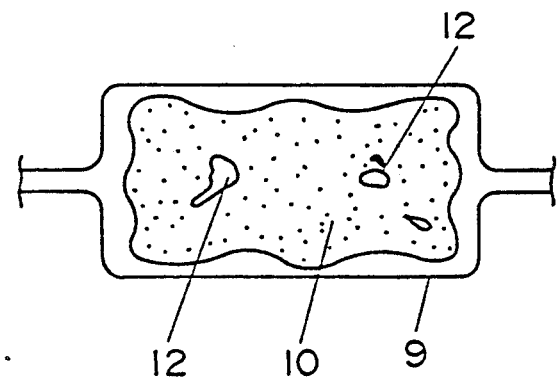
FIG. 6 is a plan view showing the state of an adhesive paste spread widely on the surface of a die pad with the nozzle of FIG. 5.
Figure 16:
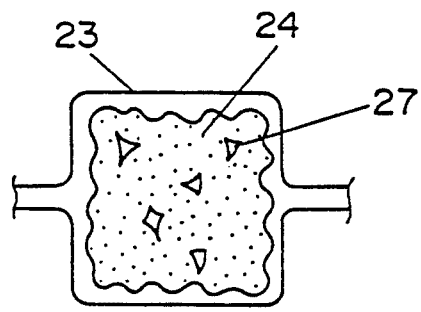
FIG. 16 is a plan view showing the state of adhesive spread widely on the surface of a die pad in the prior art.
Figure 17:
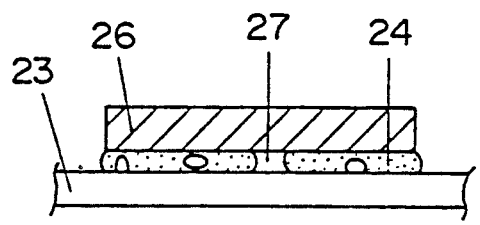
FIG. 17 is a sectional view showing the state of the die adhered to the die pad in the prior art.

When the adhesive paste is applied by using such nozzles, and is spread widely by pressing with a rectangular die, voids 12 may be formed inside the spread adhesive paste 10, as shown in FIG. 6. The reason for this is as follows. As the aspect ratio of the die increases, the interval of the adjacent nozzles becomes narrow, especially near the center. Accordingly, the nozzles cannot be located at positions 4a and 4b, shown by broken line in FIG. 5. As a result, the arrangement of nozzles near points 4a and 4b becomes similar to the conventional matrix arrangement as shown in FIG. 16, and the air entrapped in this area may directly remain in the adhesive paste 10 as voids 12.

Figure 7:
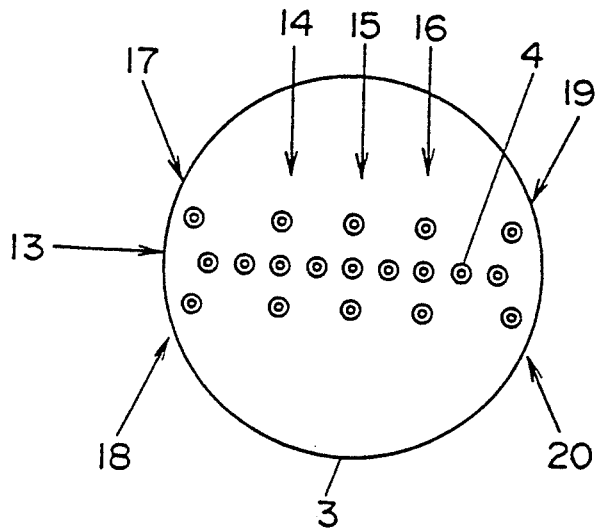
FIG. 7 is a bottom view of a nozzle apparatus used in a second embodiment.
Figure 8:
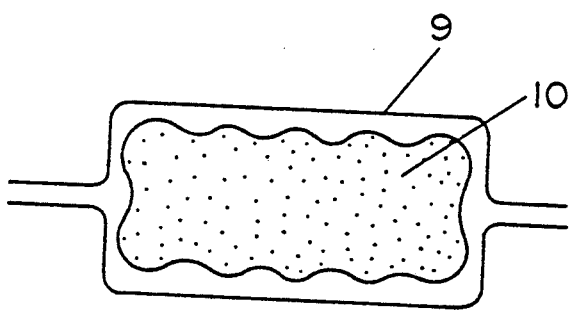
FIG. 8 is a plan view showing the state of the adhesive paste spread widely on the surface of the die pad with the nozzle device of FIG. 7.

FIG. 7 and FIG. 8 show a second embodiment of the invention to be used in adhesion of a rectangular die having a large aspect ratio.

In FIG. 7, a nozzle row 13 is composed of nine nozzles, arranged on a center line in the longitudinal direction of the die. Nozzle rows 14, 15 and 16 are composed of three nozzles individually, and these nozzle rows 14, 15 and 16 are arranged so as to cross orthogonally with the nozzle row 13 near the center. At both sides of the nozzle row 13, furthermore, four nozzle rows 17, 18, 19 and 20 are formed so as to extend radially from the nozzles at both ends toward the outside. In other words, near the center, the nozzles are arranged in a cross shape by the nozzle rows 13, 14, 15 and 16, and at the right and left ends the nozzles are formed in a > shape and a < shape by the nozzle rows 17, 18, 19 and 20.

When the adhesive paste is applied in spots in the surface of the die pad by using this nozzle apparatus, and the die is pressed against the surface of the die pad, the arrangement are given below with respect to each of FIGS. 10(A) to 10(Q).

Figure 10A:
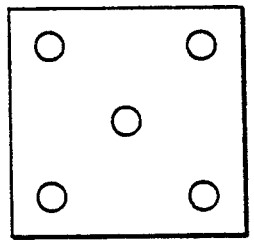
FIGS. 10 (A) to (Q) show the nozzle arrangements illustrated in FIG. 9, labelled A to Q.

FIG. 10(A) is a square chip of 4.0 mm sides. The distance between the nozzles along the diagonals is 1.83 mm. The distance from the center of a nozzle in the corners of the square to the sides of the square is 0.7 mm. It is another 1.3 mm to the mid point of a side in the same direction from the center of that nozzle. The chip size for the configuration as illustrated in FIG. 10(A) is (x) equal to 4.3–6.0 mm and (y) equal to 4.0–6.0 mm. The diameter of the nozzles in this case is 21 G, and the length of the nozzles is 2.5 mm. There are five nozzles, and the pitch of the nozzles is 1.83.

Figure 10B:
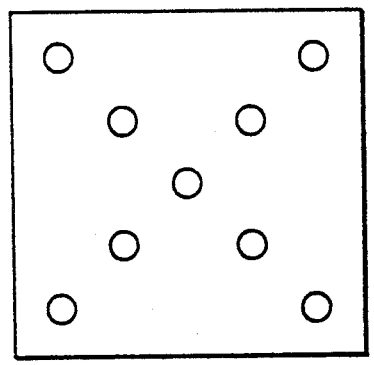

FIG. 10(B) is similar to FIG. 10(A), but has more nozzles. Each side of the square measures 6.0 mm. The nozzles are spaced along their diagonals at 1.55 mm. The distance of 0.8 mm extends from the center of a nozzle to an adjacent side of the square, for the nozzles in the corners. In either the x or y directions, there is 1.1 mm measured in these directions separating each nozzle from the next nozzle moving in the same direction. The chip size in this case varies, for the x direction, from 6.0 to 8.0 mm, and for the y direction varies from 6.0 to 8.0 mm. The diameter of the nozzles is 21 G, and the length of the nozzles is 2.5 mm. There are nine nozzles, with a nozzle pitch of 1.55.

Figure 10C:
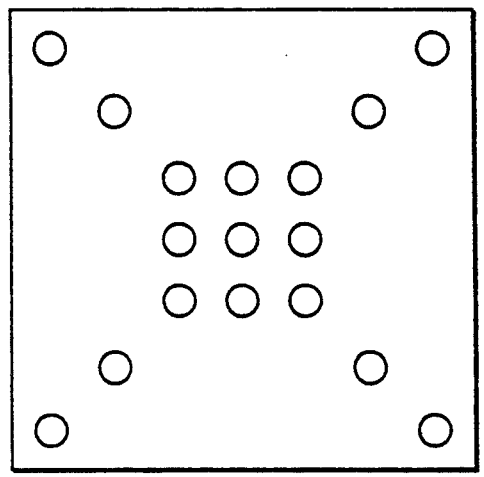

FIG. 10(C) illustrates a square having a side measuring 8.0 mm. The nozzles along the diagonals are separated at 1.55 mm. 1.1 mm separates each nozzle from an adjacent nozzle in either the x direction or the y direction. The nozzles at the corners measure 0.7 mm from their centers to the adjacent sides. The chip size in this case is 8.0 mm to 10.0 mm for both the x and y directions. The nozzle diameters is 21 G, and the length of the nozzles is 2.5 mm. There are 17 nozzles having a nozzle pitch of 1.55.

Figure 10D:
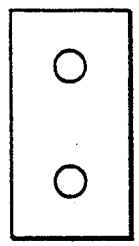

FIG. 10(D) illustrates a rectangle having one side measuring 4.0 mm and one side measuring 2.0 mm. The nozzles are separated at 2.0 mm. The nozzles measure 1.0 mm from their centers to the adjacent sides. The chip size in this case is 2.0 mm to 4.0 mm for the x direction and 4.0 to 6.0 for the y direction. The nozzle diameters is 21 G, and the length of the nozzles is 2.5 mm. There are 2 nozzles having a nozzle pitch of 2.0.

Figure 10E:
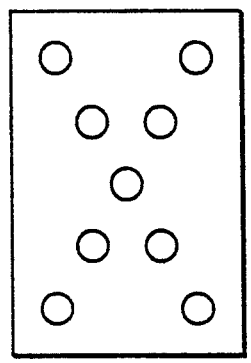

FIG. 10(E) illustrates a rectangle having one side measuring 6.0 mm and one side measuring 4.0 mm. The nozzles along the diagonals are separated at 1.25 mm. 1.1 mm separates each nozzle from an adjacent nozzle in the y direction, and 0.6 mm in the x direction. The nozzles at the corners measure 0.8 mm from their centers to the adjacent sides. The chip size in this case is 4.0 mm to 6.0 mm for the x direction and 6.0 to 8.0 for the y direction. The nozzle diameters are 21 G, and the length of the nozzles is 2.5 mm. There are 9 nozzles having a nozzle pitch of 1.25.

Figure 10F:
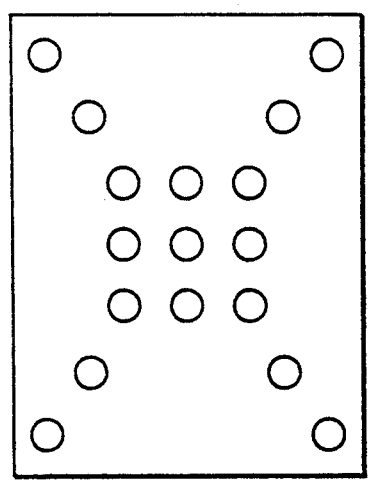

FIG. 10(F) illustrates a rectangle having one side measuring 8.0 mm and one side measuring 6.0 mm. 1.1 mm separates each nozzle from an adjacent nozzle in the y direction, except for the end nozzles along the diagonals, which are separated by 1.2 mm from the adjacent nozzle. In the x direction, the nozzles are spaced, from the center outwardly, 1.1 mm, 0.6 mm, and 0.7 mm, respectively. The nozzles at the corners measure 0.6 mm from their centers to the adjacent sides. The chip size in this case is 6.0 to 8.0 mm for the x direction and 8.0 to 10.0 mm for the y direction. The nozzle diameter is 21 G, and the length of the nozzles is 2.5 mm. There are 17 nozzles having a nozzle pitch of 1.25.

Figure 10G:
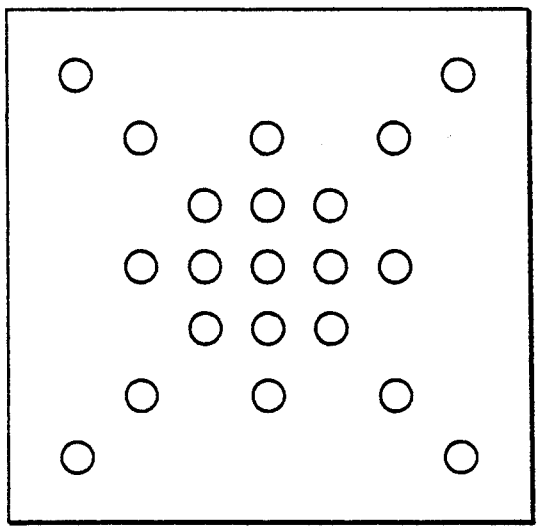

FIG. 10(G) illustrates a square having a side measuring 9.0 mm. The nozzles along the diagonals are separated at 1.55 mm. 1.1 separates each nozzle from an adjacent nozzle in either the x direction or the y direction. The nozzles at the corners measure 1.2 mm from their centers to the adjacent sides. The chip size in this case is 9.0 to 11.0 for both the x and y directions. The nozzle diameter is 21 G, and the length of the nozzles is 2.5 mm. There are 21 nozzles having a nozzle pitch of 1.55.

Figure 10H:
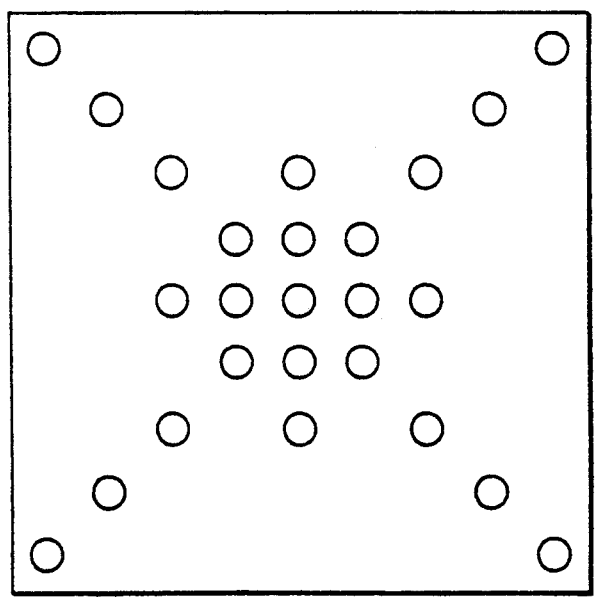

FIG. 10(H) illustrates a square having a side measuring 10.0 mm. The nozzles along the diagonals are separated at 1.55 mm. 1.1 mm separates each nozzles from an adjacent nozzle in either the x direction or the y direction. The nozzles at the corners measure 0.6 mm from their centers to the adjacent sides. The chip size in this case is 10.0 to 12.0 mm for both the x and y directions. The nozzle diameter is 21 G, and the length of the nozzles is 2.5 mm. There are 25 nozzles having a nozzle pitch of 1.55.

Figure 10I:
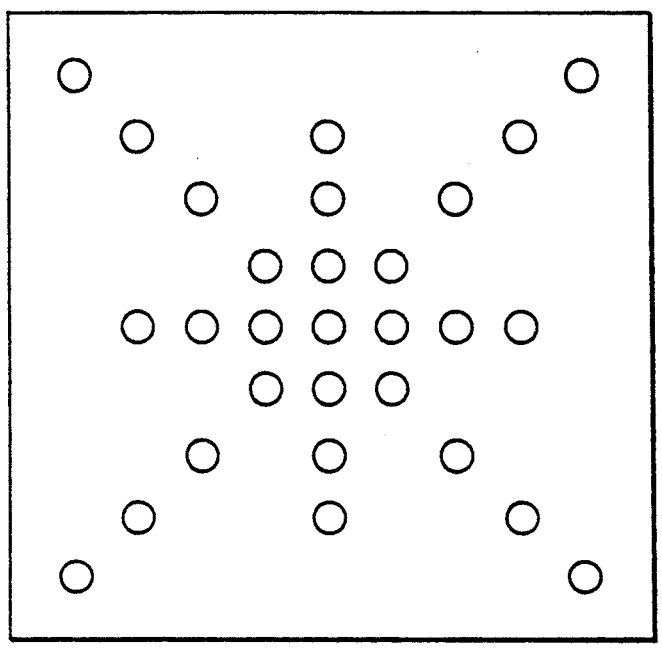

FIG. 10(I) illustrates a square having a side measuring 11.0 mm. The nozzles along the diagonals are separated at 1.55 mm. 1.1 mm separates each nozzles from an adjacent nozzle in either the x direction or the y direction. The nozzles at the corners measure 1.1 mm from their centers to the adjacent sides. The chip size in this case is 11.0 to 13.0 mm for both the x and y directions. The nozzle diameter is 21 G, and the length of the nozzles is 2.5 mm. There are 29 nozzles having a nozzle pitch of 1.55.

Figure 10J:
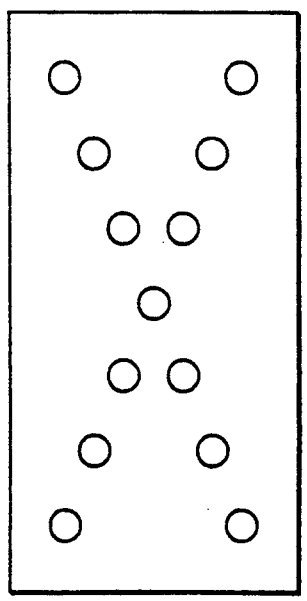

FIG. 10(J) illustrates a rectangle having one side measuring 10.0 mm and one side measuring 5.0 mm. The nozzles along the diagonals are separated at 1.4 mm. 1.3 mm separates each nozzle from an adjacent nozzle in the y direction. 0.5 mm separates each nozzle in the x direction. The nozzles at the corners measure 1.0 mm and 1.1 mm from their centers to the respective adjacent long and short sides. The chip size in this case is 5.0 to 7.0 mm for the x direction and 10.0 to 12.0 for the y direction. The nozzle diameter is 22 G, and the length of the nozzles is 2.5 mm. There are 13 nozzles having a nozzle pitch of 1.4.

Figure 10K:
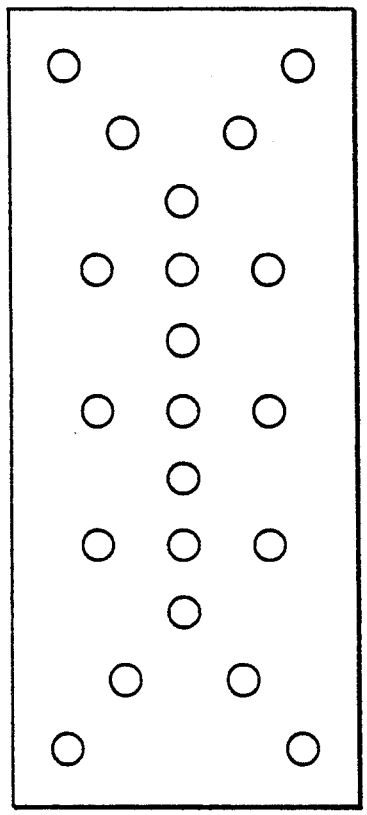

FIG. 10(K) illustrates a rectangle having one side measuring 14.0 mm and one side measuring 6.0 mm. 1.2 mm separates each nozzle from an adjacent nozzle in the y direction. 1.0, 0.5 and 0.5 mm separates each nozzle from the next nozzle, moving in the x direction, from the center axis. The nozzles at the corners measure 1.0 mm from their centers to the adjacent sides. The chip size in this case is 5.9 to 7.9 mm for the x direction and 13.8 to 15.8 mm for the y direction. The nozzle diameter is 21 G, and the length of the nozzles is 2.5 mm. There are 21 nozzles having a nozzle pitch of 1.2.

Figure 10L:
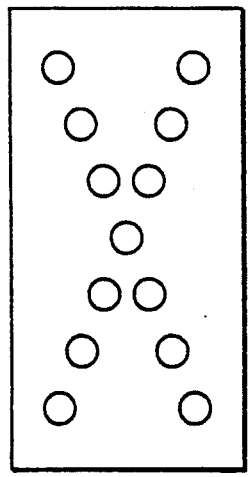

FIG. 10(L) illustrates a rectangle having a side measuring 8.0 mm and a side measuring 4.0 mm. The nozzles along the diagonals are separated at 1.04 mm. 1.0 mm separates each nozzle from an adjacent nozzle in the y direction. 0.5, 0.3 and 0.4 mm separates the nozzles in the x direction, moving from the center line toward one side. The nozzles at the corners measure 0.8 mm from their centers to the adjacent long side and 1.0 mm to the adjacent short side. The chip size in this case is 4.0 to 6.0 mm for the x direction and 8.0 to 10.0 mm for the y direction. The nozzle diameter is 22 G, and the length of the nozzles is 2.5 mm. There are 13 nozzles having a nozzle pitch of 1.04.

Figure 10M:
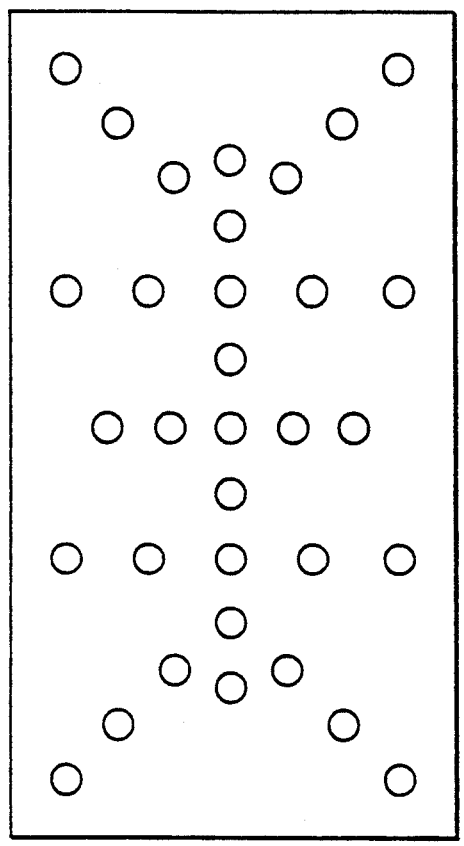

FIG. 10(M) illustrates a rectangle having one side measuring 15.0 mm and one side measuring 8.0 mm. A row of nozzles along a center longitudinal axis of the rectangle is separated at 1.2 mm distances. Four diagonal rows extend to the corners of the rectangle from the penultimate nozzles of the central longitudinal row of nozzles. In the y axis direction, the nozzles of the diagonals are spaced, initially, at 0.9 mm, and then at 1.0 mm separations. The end nozzles of the central longitudinal axis are only spaced 0.3 mm further in the y direction from the first nozzles extending off of the central longitudinal axis along their respective diagonals. The three nozzles of each of the diagonals is spaced from the central longitudinal axis in the x axis direction at 1.0 mm, 2.0 mm and 3.0 mm, respectively. Three intermediate rows of nozzles are also present, extending perpendicularly from the central longitudinal axis. The nozzles of the outer perpendicular rows of nozzles are at 1.5 mm separations in the x axis direction. The central row of nozzles is at 1.1 mm separations. The nozzles of the corners measure 1.0 mm from their centers to their adjacent sides. The chip size in this case ranges from 8.0 mm to 10.0 mm in the x direction and 15.0 to 17.0 mm in the y direction. A nozzle diameter is 21 G, and length of the nozzles is 2.5 mm. There are 33 nozzles having a nozzle pitch of 1.04.

Figure 10N:
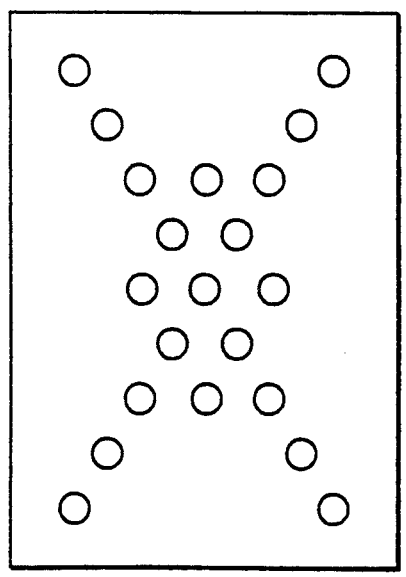

FIG. 10(N) illustrates a rectangle having a side measuring 10.0 mm and a side measuring 7.0 mm. 1.0 mm separates the nozzles in the y direction and 0.6 mm separates them in the x direction. The nozzles at the corners measure 1.0 mm from their centers to the adjacent short sides and 1.1 mm to the adjacent long sides. The chip size in this case is 7.0 to 9.0 mm for the x direction and 10.0 to 12.0 mm for the y direction. The nozzle diameter is 22 G, and the length of the nozzles is 2.5 mm. There are 21 nozzles having a nozzle pitch of 1.2.

Figure 10O:
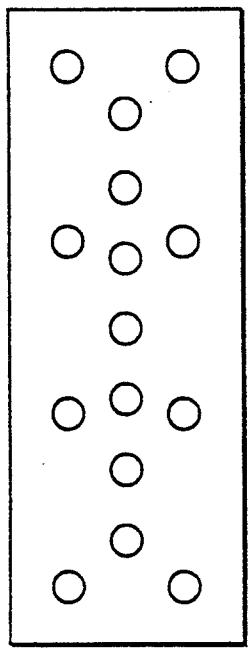

FIG. 10(O) illustrates a rectangle having a central row of nozzles and two rows of nozzles parallel thereto. The central row has its nozzles spaced at 1.2 mm and the two adjacent rows have their nozzles spaced at 3.0 mm. There is 1.5 mm from the central nozzle of the central row to the first nozzles of the other rows in the y direction. 1.0 mm separates the rows in the x direction. The chip size in this case is 4.0 to 6.0 mm in the x direction and 11.0 to 13.0 mm in the y direction. A nozzle diameter is 22 G, and the length of the nozzles is 2.5 mm. There are 15 nozzles having an nozzle pitch of 1.2.

Figure 10Q:
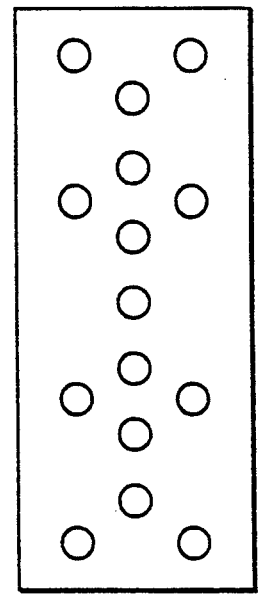
Figure 10P:
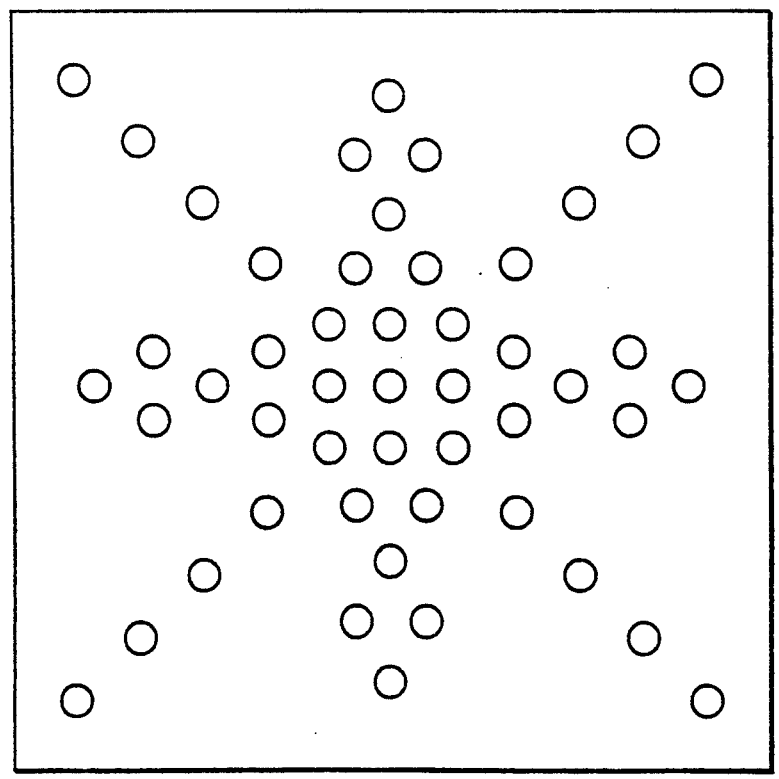

FIG. 10(P) illustrates a further square having an arrangement of nozzles thereon. There are two main diagonal rows of nozzles across the square and two rows of nozzles disposed at 45 degrees to the diagonal rows and intersecting at the intersection point of the diagonal rows. In addition, each of the second set of rows of nozzles has two rows of nozzles parallel thereto. The respective sets of rows will be referred to as the first (diagonal), the second and the third (parallel) rows of nozzles. The nozzles of the first set of rows are spaced in both the x and y directions from the mid point of the square at 1.1 mm separations. The first nozzles of the second rows i.e. the nozzles closest to the center point of the square, are also spaced 1.1 mm from the center point. The next two nozzles in the second rows are spaced at distances of 3.1 and 5.1 mm from the center point in the respective directions of the respective rows. Each of the third rows of nozzles have their nozzles spaced at 2.1 and 4.1 mm from the center point in either the x or y direction, and 0.6 mm from the center point in the other direction. The chip size in this case varies from 13.0 to 15.0 mm for both the x and y directions. The nozzle diameter is 22 G, and the length of the nozzles is 2.5 mm. There are 45 nozzles having a nozzle pitch of 1.1.

FIG. 10(Q) illustrates a rectangle having three rows of nozzles thereon. The rows of nozzles are separated in the x axis direction at 1 mm separations. The nozzles of the central longitudinal row of nozzles are separated at spaced of 1.1 mm. The more central nozzles, referring to the wide direction, of the outer rows, are separated at 3.0 mm, while the next nozzles of these rows are only 2.5 mm further. In this case, the chip size varied from 3.5 to 5.5 mm for the x direction and 10.0 to 12.0 mm for the y direction. The nozzle diameter is 22 G, and the length of the nozzles is 2.5 mm. There are 15 nozzles having a nozzle pitch of 1.1. adjacent adhesive paste. Accordingly, as shown in FIG. 8, the adhesive paste 10 can be spread nearly in a rectangular form without causing voids on the surface of the die pad 9. As a result, the adhesive paste 10 is spread over the entire region beneath the rectangular die, and voids are not formed, so that the adhesion strength of the die and the thermal and electrical conductivity may both be enhanced.

Two examples of nozzle arrangement of the invention has been presented in FIGS. 2 and 7, but it is, anyway, desired to vary the nozzle arrangement depending on the shape of the die.

Figure 9:
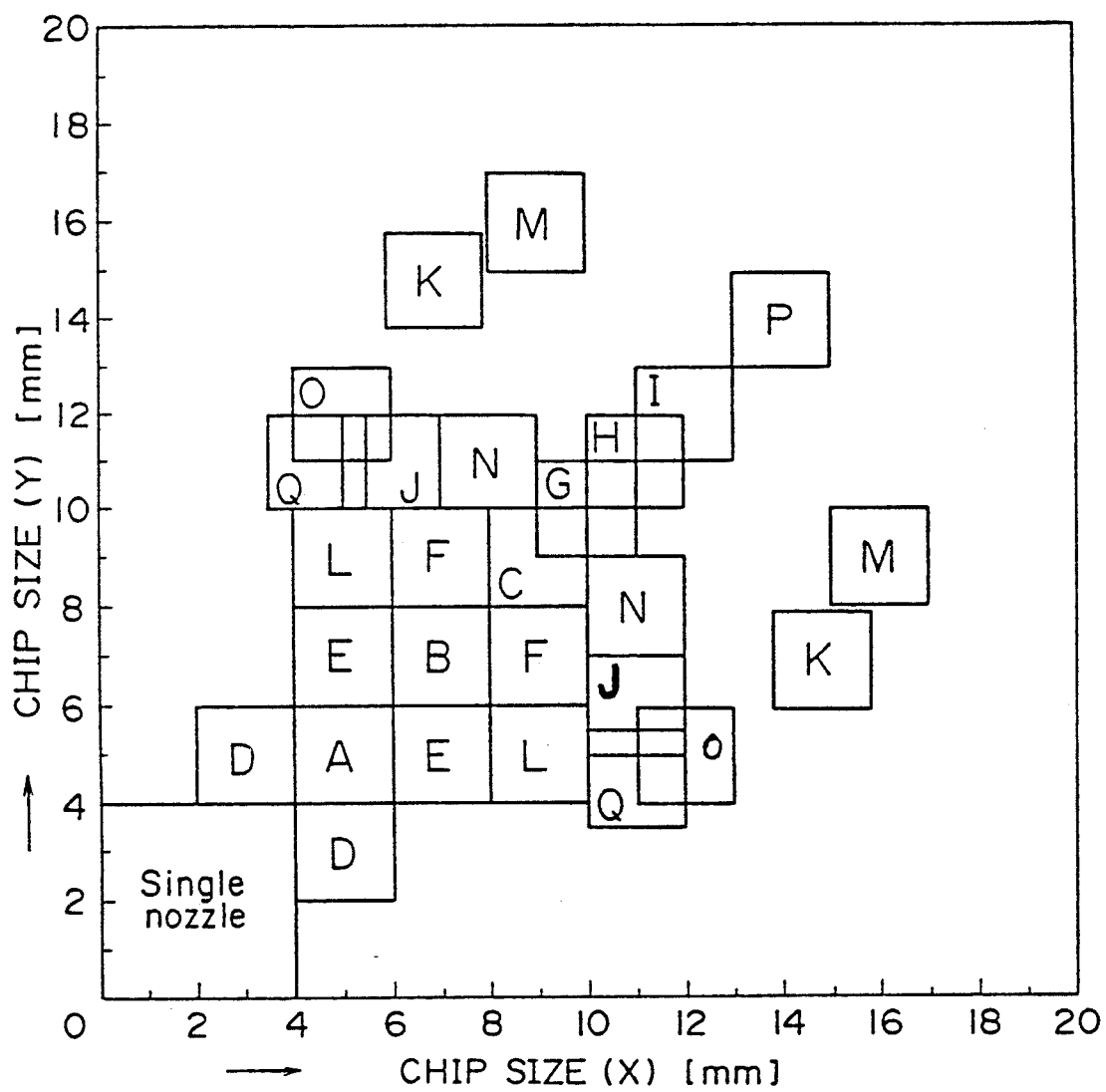
FIG. 9 is a graph showing the relation between the chip (die) size and the nozzle arrangement.

FIG. 9 and FIG. 10 (A) to (Q) shows the various die shapes and the nozzle arrangements suitable for each die shape.

FIG. 9 shows the relation between the die shape and nozzle arrangement. The axis of the abscissas of FIG. 9 show the length of the die in the X-direction [chip size (X)], and the axis of ordinates represents the length of the die in the Y-direction [chip size (Y)]. Symbols A to Q in FIG. 9 corresponds to the nozzle arrangements shown in FIG. 10 (A) to (Q), respectively. As understood from FIG. 9, the nozzle arrangements A to Q distribute symmetrically from the diagonal line.

As shown in FIG. 9, within a chip size of 4 mm×4 mm, only one nozzle is enough, and within a chip size of x=2.0 to 4.0 mm, Y=4.0 to 6.0 mm, it is enough to install two nozzles in the longitudinal direction of the die as shown in FIG. 10 (D). In these cases, the arrangement is not radial in its strict sense of meaning.

When the chip size is in a range of X=4.0 to 6.0 mm, Y=4.0 to 6.0 mm, five nozzles are installed radially as shown in FIG. 10 (A). Similarly, when the shape of the die is square or a rectangle similar to a square, radial nozzle arrangements B, C, E, F, G, H, I, J, L, and N may be employed. Practical layouts are shown in the corresponding drawings in FIG. 10 (B), (C), (E), (F), (G), (H), (I), (J), (L), and (N).

On the other hand, when the chip size is rectangular, the arrangements K, M, O, P and Q, which are substantially same as the arrangement shown in FIG. 7, may be employed. Practical layouts are also shown in the corresponding drawings in FIG. 10 (K), (M), (O), (P) and (Q).

Examples of nozzle diameters, nozzle lengths, the number of nozzles and the nozzle interval in each nozzle arrangement are given below with respect to each of FIGS. 10(A) to 10(Q).

FIG. 10(A) is a square chip of 4.0 mm sides. The distance between the nozzles along the diagonals is 1.83 mm. The distance from the center of a nozzle in the corners of the square to the sides of the square is 0.7 mm. It is another 1.3 mm to the mid point of a side in the same direction from the center of that nozzle. The chip size for the configuration as illustrated in FIG. 10(A) can be (x) equal to 4.0-6.0 mm and (y) equal to 4.0-6.0 mm. The diameter of the nozzles in this case is 21 G, and the length of the nozzles is 2.5 mm. There are five nozzles, and the pitch of the nozzles is 1.83.

FIG. 10(B) is similar to FIG. 10(A), but has more nozzles. Each side of the square measures 6.0 mm. The nozzles are spaced along their diagonals at 1.55 mm. The distance of 0.8 mm extends from the center of a nozzle to an adjacent side of the square, for the nozzles in the corners. In either the x or y directions, there is 1.1 mm measured in the directions separating each nozzle from the next nozzle moving in the same direction. The chip size in this case varies, for the x direction, from 6.0 to 8.0 mm, and for the y direction varies from 6.0 to 8.0 mm. The diameter of the nozzles is 21 G, and the length of the nozzles is 2.5 mm. There are nine nozzles, with a nozzle pitch of 1.55.

FIG. 10(C) illustrates a square having a side measuring 8.0 mm. The nozzles along the diagonals are separated at 1.55 mm. 1.1 mm separates each nozzle from an adjacent nozzle in either the x direction or the y direction. The nozzles at the corners measure 0.7 mm from their centers to the adjacent sides. The chip size in this case is 8.0 mm to 10.0 mm for both the x and y directions. The nozzle diameters is 21 G, and the length of the nozzles is 2.5 mm. There are 17 nozzles having a nozzle pitch of 1.55.

FIG. 10(D) illustrates a rectangle having one side measuring 4.0 mm and one side measuring 2.0 mm. The nozzles are separated at 2.0 mm. The nozzles measure 1.0 mm from their centers to the adjacent sides. The chip size in this case is 2.0 mm to 4.0 mm for the x direction and 4.0 to 6.0 for the y direction. The nozzle diameters is 21 G, and the length of the nozzles is 2.5 mm. There are 2 nozzles having a nozzle pitch of 2.0.

FIG. 10(E) illustrates a rectangle having one side measuring 6.0 mm and one side measuring 4.0 mm. The nozzles along the diagonals are separated at 1.25 mm. 1.1 mm separates each nozzle from an adjacent nozzle in the y direction, and 0.6 mm in the x direction. The nozzles at the corners measure 0.8 mm from their centers to the adjacent sides. The chip size in this case is 4.0 mm to 6.0 mm for the x direction and 6.0 to 8.0 for the y direction. The nozzle diameters are 21 G, and the length of the nozzles is 2.5 mm. There are 9 nozzles having a nozzle pitch of 1.25.

FIG. 10(F) illustrates a rectangle having one side measuring 8.0 mm and one side measuring 6.0 mm. 1.1 mm separates each nozzle from an adjacent nozzle in the y direction, except for the end nozzles along the diagonals, which are separated by 1.2 mm from the adjacent nozzle. In the x direction, the nozzles are spaced, from the center outwardly, 1.1 mm, 0.6 mm, and 0.7 mm, respectively. The nozzles at the corners measure 0.6 mm from their centers to the adjacent sides. The chip size in this case is 6.0 to 8.0 mm for the x direction and 8.0 to 10.0 mm for the y direction. The nozzle diameter is 21 G, and the length of the nozzles is 2.5 mm. There are 17 nozzles having a minimum nozzle pitch of 1.25.

FIG. 10(G) illustrates a square having a side measuring 9.0 mm. The nozzles along the diagonals are separated at 1.55 mm. 1.1 separates each nozzle from an adjacent nozzle in either the x direction or the y direction. The nozzles at the corners measure 1.2 mm from their centers to the adjacent sides. The chip size in this case can be 9.0 to 11.0 for both the x and y directions. The nozzle diameter is 21 G, and the length of the nozzles is 2.5 mm. There are 21 nozzles having a nozzle pitch of 1.55.

FIG. 10(H) illustrates a square having a side measuring 10.0 mm. The nozzles along the diagonals are separated at 1.55 mm. 1.1 mm separates each nozzle from an adjacent nozzle in either the x direction or the y direction. The nozzles at the corners measure 0.6 mm from their centers to the adjacent sides. The chip size in this case is 10.0 to 12.0 mm for both the x and y directions. The nozzle diameter is 21 G, and the length of the nozzles is 2.5 mm. There are 25 nozzles having a nozzle pitch of 1.55.

FIG. 10(I) illustrates a square having a side measuring 11.0 mm. The nozzles along the diagonals are separated at 1.55 mm. 1.1 mm separates each nozzle from an adjacent nozzle in either the x direction or the y direction. The nozzles at the corners measure 1.1 mm from their centers to the adjacent sides. The chip size in this case is 11.0 to 13.0 mm for both the x and y directions. The nozzle diameter is 21 G, and the length of the nozzles is 2.5 mm. There are 29 nozzles having a nozzle pitch of 1.55.

FIG. 10(J) illustrates a rectangle having one side measuring 10.0 mm and one side measuring 5.0 mm. The nozzles along the diagonals are separated at 1.4 mm. 1.3 mm separates each nozzle from an adjacent nozzle in the y direction. 0.5 mm separates each nozzle in the x direction. The nozzles at the corners measure 1.0 mm and 1.1 mm from their centers to the respective adjacent long and short sides. The chip size in this case is 5.0 to 7.0 mm for the x direction and 10.0 to 12.0 mm for the y direction. The nozzle diameter is 22 G, and the length of the nozzles is 2.5 mm. There are 13 nozzles having a nozzle pitch of 1.4.

FIG. 10(K) illustrates a rectangle having one side measuring 14.0 mm and one side measuring 6.0 mm. 1.2 mm separates each nozzle from an adjacent nozzle in the y direction. 1.0, 0.5 and 0.5 mm separates each nozzle from the next nozzle, moving in the x direction, from the center axis. The nozzles at the corners measure 1.0 mm from their centers to the adjacent sides. The chip size in this case is 5.9 to 7.9 mm for the x direction and 13.8 to 15.8 mm for the y direction. The nozzle diameter is 21 G, and the length of the nozzles is 2.5 mm. There are 21 nozzles having a nozzle pitch of 1.2.

FIG. 10(L) illustrates a rectangle having a side measuring 8.0 mm and a side measuring 4.0 mm. The nozzles along the diagonals are separated at 1.04 mm. 1.0 mm separates each nozzle from an adjacent nozzle in the y direction. 0.5, 0.3 and 0.4 mm separates the nozzles in the x direction, moving from the center line toward one side. The nozzles at the corners measure 0.8 mm from their centers to the adjacent long side and 1.0 mm to the adjacent short side. The chip size in this case is 4.0 to 6.0 mm for the x direction and 8.0 to 10.0 mm for the y direction. The nozzle diameter is 22 G, and the length of the nozzles is 2.5 mm. There are 13 nozzles having a minimum nozzle pitch of 1.04.

FIG. 10(M) illustrates a rectangle having one side measuring 15.0 mm and one side measuring 8.0 mm. A row of nozzles along a center longitudinal axis of the rectangle is separated at 1.2 mm distances. Four diagonal rows extend to the corners of the rectangle from the penultimate nozzles of the central longitudinal row of nozzles. In the y axis direction, the nozzles of the diagonals are spaced, initially, at 0.9 mm, and then at 1.0 mm separations. The end nozzles of the central longitudinal axis are only spaced 0.3 mm further in the y direction from the first nozzles extending off of the central longitudinal axis along their respective diagonals. The three nozzles of each of the diagonals is spaced from the central longitudinal axis in the x axis direction at 1.0 mm, 2.0 mm and 3.0 mm, respectively. Three intermediate rows of nozzles are also present, extending perpendicularly from the central longitudinal axis. The nozzles of the outer perpendicular rows of nozzles are at 1.5 mm separations in the x axis direction. The central row of nozzles is at 1.1 mm separations. The nozzles at the corners measure 1.0 mm from their centers to their adjacent sides. The chip size in this case ranges from 8.0 mm to 10.0 mm in the x direction and 5.0 to 17.0 mm in the y direction. A nozzle diameter is 21 G, and the length of the nozzles is 2.5 mm. There are 33 nozzles having a minimum nozzle pitch of 1.04.

FIG. 10(N) illustrates a rectangle having a side measuring 10.0 mm and a side measuring 7.0 mm. 1.0 mm separates the nozzles in the y direction and 0.6 mm separates them in the x direction. The nozzles at the corners measure 1.0 mm from their centers to the adjacent short sides and 1.1 mm to the adjacent long sides. The chip size in this case is 7.0 to 9.0 mm for the x direction and 10.0 to 12.0 mm for the y direction. The nozzle diameter is 22 G, and the length of the nozzles is 2.5 mm. There are 21 nozzles having a minimum nozzle pitch of 1.2.

FIG. 10(O) illustrates a rectangle having a central row of nozzles and two rows of nozzles parallel thereto. The central row has its nozzles spaced at 1.2 mm and the two adjacent rows have their nozzles spaced at 3.0 mm. There is 1.5 mm from the central nozzle of the central row to the first nozzles of the other rows in the y direction. 1.0 mm separates the rows in the x direction. The chip size in this case is 4.0 to 6.0 mm in the x direction and 11.0 to 13.0 mm in the y direction. A nozzle diameter is 22 G, and the length of the nozzles is 2.5 mm. There are 15 nozzles having a minimum nozzle pitch of 1.2.

FIG. 10(P) illustrates a further square having an arrangement of nozzles thereon. There are two main diagonal rows of nozzles across the square and two rows of nozzles disposed at 45 degrees to the diagonal rows and intersecting at the intersection point of the diagonal rows. In addition, each of the second set of rows of nozzles has two rows of nozzles parallel thereto. The respective sets of rows will be referred to as the first (diagonal), the second and the third (parallel) rows of nozzles. The nozzles of the first set of rows are spaced in both the x and y directions from the mid point of the square at 1.1 mm separations. The first nozzles of the second rows i.e. the nozzles closest to the center point of the square, are also spaced 1.1 mm from the center point. The next two nozzles in the second rows are spaced at distances of 3.1 and 5.1 mm from the center point in the respective directions of the respective rows. Each of the third rows of nozzles have their nozzles spaced at 2.1 and 4.1 mm from the center point in either the x or y direction, and 0.6 mm from the center point in the other direction. The chip size in this case varies from 13.0 to 15.0 mm for both the x and y directions. The nozzle diameter is 22 G, and the length of the nozzles is 2.5 mm. There are 45 nozzles having a nozzle pitch of 1.1.

FIG. 10(Q) illustrates a rectangle having three rows of nozzles thereon. The rows of nozzles are separated in the x axis direction at 1 mm separations. The nozzles of the central longitudinal row of nozzles are separated at spaces of 1.1 mm. The more central nozzles, referring to the wide direction, of the outer rows, are separated at 3.0 mm, while the next nozzles of these rows are only 2.5 mm further. In this case, the chip size varied from 3.5 to 5.5 mm for the x direction and 10.0 to 12.0 mm for the y direction. The nozzle diameter is 22 G, and the length of the nozzles is 2.5 mm. There are 15 nozzles having a nozzle pitch of 1.1.

According to the experiment by the present inventor, the relation as shown in Table 1 is found between the nozzle size and the minimum intervals of nozzles.

TABLE 1

| Gauge | 20G | 21G | (Unit: mm) 22G |
| --- | --- | --- | --- |
| Inside diameter | 0.58 | 0.49 | 0.39 |
| Outside diameter | 0.91 | 0.83 | 0.72 |
| Minimum interval | 1.2 | 1.1 | 1.0 |

The nozzle interval shown in FIG. 10(A) to (Q) is defined as small as possible according to Table 1.

Figure 11:
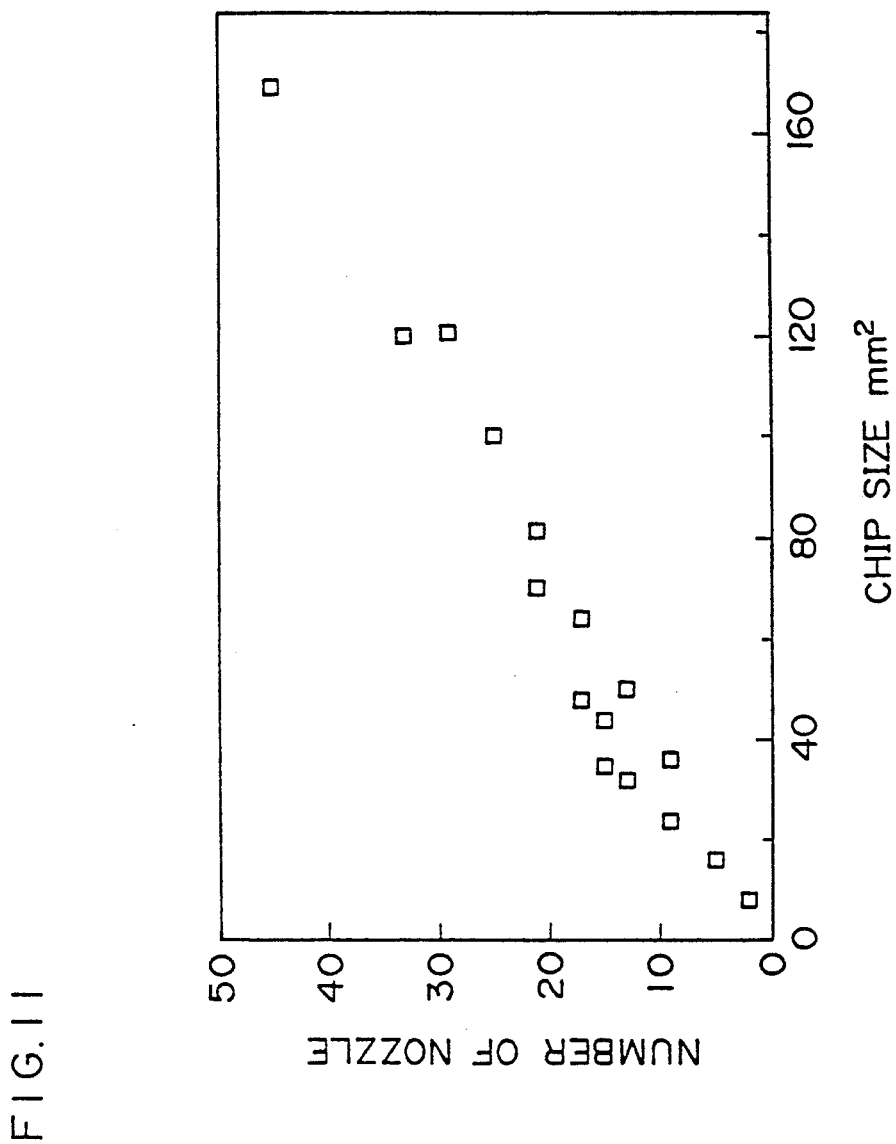
FIG. 11 is a graph showing the relation between the chip (die) size and the number of nozzles.

The number of nozzles varies with the chip size, viscosity and thixotropy of silver epoxy paste, and for example, in the case of viscosity of silver epoxy paste: 330 poise (the measurement obtained by rotating the cone with center angle of 1°3' at 0.5 rpm, using EHD type instrument); thixotropy: 6.5 (measured at 5.0 rpm/0.5 rpm)

the number of nozzles is, as shown in FIG. 11, nearly proportional to the chip size. This is considered because the area covered by one nozzle is almost determined in order to realize the conditions of 1. reducing the thickness of silver paste, and
2. spreading over the entire surface by discharging as little silver paste as possible from one nozzle.

Meanwhile, the adhesive pastes within the viscosity of 150 to 1000 poise and thixotropy of 4.5 to 7.0 can be used by properly considering the nozzle diameter or nozzle arrangement.

As for the nozzle aperture, the larger the diameter, the stronger becomes the nozzle, and it is harder to break. Or in the case of the nozzle having an inside diameter of 0.3 mm or more, the adhesive paste can be easily removed if jammed. Considered from these aspects, the nozzle diameter should be as large as possible. On the other hand, to reduce the nozzle intervals, the smaller nozzle diameter is preferred. As a result of experiment by paying attention to these points, it has been confirmed that the silver epoxy paste can be discharged stably, in the case of the viscosity of silver paste of 330 poise, by using nozzles with a bore of 20 G to 22 G. The nozzle diameters in the arrangements shown in FIG. 10 (A) to (Q) are defined somewhere between 20 G and 22 G.

Incidentally, it is not necessary to use plural nozzles of the same diameter. For example, in the embodiment shown in FIG. 2, by using nozzles having different diameters in the nozzle rows 5 and 6, and nozzle rows 7 and 8, the adhesive paste can be applied favorably.

As the materials for the nozzles, stainless steel (SUS304), ruby (ceramic), and polypropylene may be considered, and the characteristics of these materials are as shown in Table 2.

TABLE 2

|  | Stainless Steel | Ruby | (Unit: mm) Polypropylene |
| --- | --- | --- | --- |
| Strength (durability) | ○ | ○ | ○ |
| Dimensional stability | ○ | ○ | x |
| Cost | ○ | x | ○ |
| Overall judgement | ○ | △ | x |

As seen from Table 2, comprehensively judging, the stainless steel is preferable as the material for nozzles.

Meanwhile, when the nozzles 4 are detachably mounted on the nozzle head 3, the nozzles 4 can be easily cleaned. In the foregoing embodiments, the nozzles 4 are shown as circular tubes having a certain length (2.5 mm in all nozzles in FIG. 9), but the sectional shape may be other than circular, such as ellipsoidal, or a slit, and the adhesive paste may also be applied by forming plural holes in the lower surface of the nozzle head 3, causing the lower surface of the nozzle head 3 to directly contact the die pad 9.

We claim:

1. A die bonding method for semiconductor devices, comprising the steps of:

providing a die pad of a lead frame to which a die is to be bonded;

providing a die having a large aspect ratio; and adhering said die to said die pad with an adhesive paste such that no voids are created in said adhesive by applying said adhesive paste in a plurality of individual spots on the surface of said die pad in a modified radial pattern and pressing said die against said adhesive paste, said modified radial pattern comprising a first row of adhesive spots arranged substantially along a center line of said die in the longitudinal direction thereof, second and third rows of adhesive spots extending from one end of said first row in a direction diagonally away from said first row toward one end of said die, fourth and fifth rows of adhesive spots extending from the opposite end of said first row in a direction diagonally away from said first row toward the opposite end of said die, and a plurality of further rows of adhesive spots orthogonal to and extending from said first row on said surface of said die pad, located along said first row between said second and third rows and said fourth and fifth rows, each said further row being shorter than said first row, and said plurality of further rows of adhesive spots extending from positions along said first row no closer to each other than every other adhesive spot of said first row;

wherein said rows of adhesive spots are applied in said step of adhering by providing a plurality of nozzles in a pattern of nozzle rows corresponding to said rows of said adhesive spots, each nozzle corresponding to a respective said adhesive spot, and applying said adhesive paste to said die pad with said plurality of nozzles.

2. The die bonding method of claim 1, wherein said die is rectangular.

3. The die bonding method of claim 1, wherein each said row of adhesive spots, other than said first row, extend from said first row in a direction either angling away from the other said rows or no more than parallel to another said row such that no said rows extending from said first row tend to converge.

4. The die bonding method of claim 3, wherein said adhesive spots are applied such that vacant portions free from adhesive are present between said rows extending from said first rows in areal amounts wider than the distance between adjacent said adhesive spots of said first row before said die is pressed against said adhesive paste.

5. The die bonding method of claim 1, wherein the nozzle diameter of each of said plurality of nozzles is defined within a range of 20 G to 22 G.

6. The die bonding method of claim 1, wherein the nozzle diameter of each of said plurality of nozzles is set at any one of 20 G, 21 G and 22 G, and the minimum interval of nozzles with said nozzle diameter of 20 G, 21 G and 22 G is set at 1.2 mm, 1.1 mm and 1.0 mm, respectively.

7. The die bonding method of claim 1, wherein ones of said plurality of nozzles have different nozzle diameters.

8. The die bonding method of claim 1, wherein said plurality of nozzles are made of stainless steel.

9. The die bonding method of claim 1, wherein said plurality of nozzles are detachably mounted on a nozzle head.

10. The die bonding method of claim 1, wherein said plurality of nozzles are composed of plural holes provided in a lower surface of a nozzle head.

11. The die bonding method of claim 1, wherein the sectional shape of each of said plurality of nozzles is circular, elliptical, or slit-shaped.

12. The die bonding method of claim 1, wherein silver epoxy paste is used as said adhesive paste.

13. A die bonding method for semiconductor devices, comprising the steps of:
providing a die pad of a lead frame to which a die is to be bonded;
providing a die having a large aspect ratio; and
adhering said die to said die pad with an adhesive paste such that no voids are created in said adhesive by applying said adhesive paste in a plurality of individual spots on the surface of said die pad in a modified radial pattern and pressing said die against said adhesive paste, said modified radial pattern comprising a first row of adhesive spots arranged substantially along a center line of said die in the longitudinal direction thereof, second and third rows of adhesive spots extending from one end of said first row in a direction diagonally away from said first row toward one end of said die, fourth and fifth rows of adhesive spots extending from the opposite end of said first row in a direction diagonally away from said first row toward the opposite end of said die, at least one further row of adhesive spots orthogonal to and extending from said first row on said surface of said die pad, located along said first row between said second and third rows and said fourth and fifth rows, each said further row being shorter than said first row, and at least one adhesive spot provided on a linear extension of said first row between at least one of said second row and said third row, and said fourth row and said fifth row;
wherein said rows of adhesive spots are applied in said step of adhering by providing a plurality of nozzles in a pattern of nozzle rows corresponding to said rows of said adhesive spots, each nozzle corresponding to a respective said adhesive spot, and applying said adhesive paste to said die pad with said plurality of nozzles.

14. The die bonding method of claim 13, wherein an adhesive spot is provided on a linear extension of said first row between both said second row and said third row, and between said fourth row and said fifth row.

15. The die bonding method of claim 13, wherein each said row of adhesive spots, other than said first row, extend from said first row in a direction either angling away from the other said rows or no more than parallel to another said row such that no said rows extending from said first row tend to converge.

16. The die bonding method of claim 13, wherein said adhesive spots are applied such that vacant portions free from adhesive are present between said rows extending from said first rows in areal amounts wider than the distance between adjacent said adhesive spots of said first row before said die is pressed against said adhesive paste.

17. The die bonding method of claim 13, wherein the nozzle diameter of each of said plurality of nozzles is defined within a range of 20 G to 22 G.

18. The die bonding method of claim 13, wherein the nozzle diameter of each of said plurality of nozzles is set at any one of 20 G, 21 G and 22 G, and the minimum interval of nozzles with said nozzle diameter of 20 G, 21 G and 22 G is set at 1.2 mm, 1.1 mm and 1.0 mm, respectively.

19. The die bonding method of claim 13, wherein ones of said plurality of nozzles have different nozzle diameters.

20. The die bonding method of claim 13, wherein said plural nozzles are made of stainless steel.

21. The die bonding method of claim 13, wherein said plurality of nozzles are detachably mounted on a nozzle head.

22. The die bonding method of claim 13, wherein said plurality of nozzles are composed of plural holes provided in a lower surface of a nozzle head.

23. The die bonding method of claim 13, wherein the sectional shape of each of said plurality of nozzles is circular, elliptical, or slit-shaped.

24. The die bonding method of claim 13, wherein silver epoxy paste is used as said adhesive paste.

25. A die bonding method for semiconductor devices, comprising the steps of:
providing a die pad of a lead frame to which a die is to be bonded;
providing a die having a large aspect ratio; and
adhering said die to said die pad with an adhesive paste such that no voids are created in said adhesive by applying said adhesive paste in a plurality of individual spots on the surface of said die pad in a modified radial pattern and pressing said die against said adhesive paste, said modified radial pattern comprising a first row of adhesive spots arranged substantially along a center line of said die in the longitudinal direction thereof, second and third rows of adhesive spots extending from one end of said first row in a direction diagonally away from said first row toward one end of said die, fourth and fifth rows of adhesive spots extending from the opposite end of said first row in a direction diagonally away from said first row toward the opposite end of said die, and a plurality of further rows of adhesive spots orthogonal to and extending from said first row on said surface of said die pad, located along said first row between said second and third rows and said fourth and fifth rows, each said further row being shorter than said first row, and said plurality of further rows of adhesive spots extending from positions along said first row no closer to each other than every other adhesive spot of said first row, and at least one adhesive spot provided on a linear extension of said first row between at least one of said second row and said third row, and said fourth row and said fifth row; wherein said rows of adhesive spots are applied in said step of adhering by providing a plurality of nozzles in a pattern of nozzle rows corresponding to said rows of said adhesive spots, each nozzle corresponding to a respective said adhesive spot, and applying said adhesive paste to said die pad with said plurality of nozzles.

26. The die bonding method of claim 25, wherein an adhesive spot is provided on a linear extension of said first row between both said second row and said third row, and between said forth row and said fifth row.

27. The die bonding method of claim 25, wherein each said row of adhesive spots, other than said first row, extend from said first row in a direction either angling away from the other said rows or no more than parallel to another said row such that no said rows extending from said first row tend to converge.

28. The die bonding method of claim 25, wherein said adhesive spots are applied such that vacant portions face free from adhesive are present between said rows extending from said first rows in areal amounts wider than the distance between adjacent said adhesive spots of said first row before said die is pressed against said adhesive paste.

29. The die bonding method of claim 25, wherein the nozzle diameter of said plurality of nozzles is defined within a range of 20 G to 22 G.

30. The die bonding method of claim 25, wherein the nozzle diameter of each of said plurality of nozzles is set at any one of 20 G, 21 G and 22 G, and the minimum interval of nozzles with said nozzle diameter of 20 G, 21 G and 22 G is set at 1.2 mm, 1.1 mm and 1.0 mm, respectively.

31. The die bonding method of claim 25, wherein ones of said plurality of nozzles have different nozzle diameters.

32. The die bonding method of claim 25, wherein said plurality of nozzles are made of stainless steel.

33. The die bonding method of claim 25, wherein said plurality of nozzles are detachably mounted on a nozzle head.

34. The die bonding method of claim 25, wherein said plurality of nozzles are composed of plural holes provided in a lower surface of a nozzle head.

35. The die bonding method of claim 25, wherein the sectional shape of each of said plurality of nozzles is circular, elliptical, or slit-shaped.

36. The die bonding method of claim 25, wherein silver epoxy paste is used as said adhesive paste.

* * * * *